(12) United States Patent
Weber et al.

(10) Patent No.: US 9,153,523 B2
(45) Date of Patent: Oct. 6, 2015

(54) ASIC ELEMENT INCLUDING A VIA

(71) Applicants: Heribert Weber, Nuertingen (DE);
Hartmut Kueppers, Reutlingen (DE);
Jochen Reinmuth, Reutlingen (DE);
Neil Davies, Sonnenbuehl-Genkingen
(DE); Jens Frey, Filderstadt (DE)

(72) Inventors: Heribert Weber, Nuertingen (DE);
Hartmut Kueppers, Reutlingen (DE);
Jochen Reinmuth, Reutlingen (DE);
Neil Davies, Sonnenbuehl-Genkingen
(DE); Jens Frey, Filderstadt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/307,108

(22) Filed: Jun. 17, 2014

(65) Prior Publication Data

US 2014/0374918 A1    Dec. 25, 2014

(30) Foreign Application Priority Data

Jun. 20, 2013  (DE) .......................... 10 2013 211 597

(51) Int. Cl.
*H01L 23/52*   (2006.01)
*H01L 23/48*   (2006.01)
*B81C 3/00*    (2006.01)

(52) U.S. Cl.
CPC .............. *H01L 23/481* (2013.01); *B81C 3/001* (2013.01)

(58) Field of Classification Search
CPC ...................................... H01L 23/481
USPC ........................................... 257/774
See application file for complete search history.

(56) References Cited

U.S. PATENT DOCUMENTS

| | | | |
|---|---|---|---|
| 7,352,040 B2 * | 4/2008 | Partridge et al. ............... | 257/419 |
| 7,824,943 B2 * | 11/2010 | Lutz et al. ....................... | 438/48 |
| 8,329,555 B2 * | 12/2012 | Reichenbach et al. ......... | 438/456 |
| 8,623,768 B2 * | 1/2014 | Lee et al. ........................ | 438/694 |
| 2011/0049652 A1 * | 3/2011 | Wu et al. ......................... | 257/417 |
| 2014/0130595 A1 * | 5/2014 | Zhao et al. ....................... | 73/495 |

* cited by examiner

*Primary Examiner* — Luan C Thai
(74) *Attorney, Agent, or Firm* — Kenyon & Kenyon LLP

(57) ABSTRACT

In an ASIC element, vias are integrated into the CMOS processing of an ASIC substrate. The ASIC element includes an active front side in which the circuit functions are implemented. The at least one via is intended to establish an electrical connection between the active front side and the rear side of the element. The front side of the via is defined by at least one front-side trench which is completely filled, and the rear side is defined by at least one rear-side trench which is not completely filled. The rear-side trench opens into the filled front-side trench.

7 Claims, 3 Drawing Sheets

ASIC ELEMENT INCLUDING A VIA

BACKGROUND OF THE INVENTION

1. Field of the Invention

The present invention generally relates to an ASIC element including an active front side, in which circuit functions are implemented, and including at least one via, which establishes an electrical connection between the active front side and the rear side of the element.

2. Description of the Related Art

Of particular significance is the use of ASIC elements including vias in the context of vertically integrated hybrid components. Such components generally include multiple different elements, which are installed one above the other in the form of a chip stack. Advantageously, the different functionalities of the elements of a component usually complement one another to achieve an application. The electrical connection between the individual elements of a vertically integrated hybrid component and also its external contacting are frequently achieved with the aid of vias, which is advantageous both for reasons of miniaturization and in the 2nd level assembly. The elements, which are combined in a vertically integrated hybrid component, may be MEMS elements having a micromechanical functionality as well as ASIC elements having a purely circuitry-wise functionality. In connection with vertically integrated hybrid components, ASIC elements are also used frequently for capping the micromechanical structure of an MEMS element. For example, vertically integrated hybrid inertial sensor components including a micromechanical sensor element and an ASIC element are known, into which the evaluation circuit for the sensor signals is integrated. In these inertial sensor components, the ASIC element is installed above the sensor structure of the MEMS element and seals it against environmental influences.

A number of implementation concepts for vias in ASIC elements are known from the related art, which are also suitable for the design of vertically integrated hybrid components and in particular for the so-called wafer-level packaging, in which the individual elements are installed in the wafer composite and only later separated as a package.

According to a known approach, the via is created in connection with the processing of the ASIC substrate, specifically as a blind opening in the ASIC substrate. This blind opening is then completely filled with a metal, such as copper or tungsten, or with a metallic layer and a dielectric, so that the surface of the ASIC substrate is preferably sealed and is flat for further processing. The rear side of this form of via is exposed and contacted only after the ASIC substrate is installed on another substrate, for example, by thinning the rear side of the ASIC substrate. In this form of implementation, the metallic core or the metallic printed conductor track of the via is protected against external influences by completely filling the blind opening or via.

Since such vias generally have a large aspect ratio, both the structuring method for producing the corresponding opening in the ASIC substrate as well as the filling are comparatively complex.

BRIEF SUMMARY OF THE INVENTION

The present invention provides an implementation concept for vias in an ASIC element, which simplifies the manufacturing process significantly.

According to the present invention, the front side of the via is defined by at least one front-side trench, which is completely filled, while the rear side of the via is defined by at least one rear-side trench, which is not completely filled. The rear-side trench opens into the filled front-side trench.

Consequently, the via in the ASIC substrate is in this case the result of a combination of front-side and rear-side processing. The ASIC substrate is structured on both sides in order to bridge the substrate thickness. Consequently, both the aspect ratio of the front-side trench as well as the aspect ratio of the rear-side trench are smaller than in the case of passage openings produced on one side in a substrate. The filling complexity is also comparatively low in this case, since only the front-side trench is filled. One particular advantage of the implementation concept according to the present invention is that at least the front-side processing may be integrated very well into the CMOS processing of an ASIC substrate. The front-side processing may be carried out simply as a bottom-trench isolation, which is customarily used for electrically isolating individual circuit components in the ASIC substrate.

Basically, the implementation concept according to the present invention for a via in an ASIC substrate may be implemented in a different manner with the aid of trenches, in particular with regard to the definition of the via.

In one first specific embodiment of the present invention, the front-side trench and the rear-side trench are implemented as annular isolation trenches, which electrically isolate a substrate area extending across the complete thickness of the ASIC substrate as a via. For that purpose, the front-side trench is at least coated using a dielectric material or even completely filled with a dielectric material. In any case, the conductive connection between the active front side and the rear side of the ASIC element in this specific embodiment is established via the semiconductor material of the ASIC substrate, so that the via is comparatively highly resistive in this case.

In another specific embodiment of the present invention, the front-side trench is electrically isolated from the adjacent semiconductor material by at least one dielectric layer, before it is filled with an electrically conductive material. In this case, the rear-side trench is also electrically isolated from the adjacent semiconductor material by at least one dielectric layer, in order to subsequently route at least one printed conductor track from one wiring layer on the rear side of the element on the wall of the rear-side trench to the electrically conductive filling of the front-side trench. In this specific embodiment, the conductive connection between the active front side and the rear side of the ASIC element is thus established by a conductive core of the filling of the front-side trench and a printed conductor track on the wall of the rear-side trench. In this case, the electrical resistance of the via thus depends on which conductive material is used for the core and the printed conductor track. If polysilicon is used for the core and printed conductor track, the via overall has a higher resistance than if a metal, such as copper, is used for the core and/or the printed conductor track.

According to the present invention, the thickness of the ASIC substrate is bridged by the front-side trench and the rear-side trench, in that the rear-side trench opens into the filled front-side trench. The depth of the front-side trench may be basically freely selected. In one preferred specific embodiment of the present invention, the depth of the front-side trench is selected based on the depth of a bottom-trench isolation of the front-side circuit functions. In this case, the front-side trench for the via may be subsequently produced and also filled together with a possible bottom-trench isolation.

As already mentioned at the outset, the implementation concept for vias according to the present invention is in particular well suited for ASIC elements, which are installed in connection with vertically integrated hybrid components. In this process, it proves to be particularly advantageous if the rear side of the ASIC element is installed on another element, so that the rear-side trench of the via is sealed and a conductive connection exists between the via and the additional element. The via is thus simply protected against environmental influences with the aid of the packaging of integrated circuits.

DETAILED DESCRIPTION OF THE INVENTION

Figure 1:
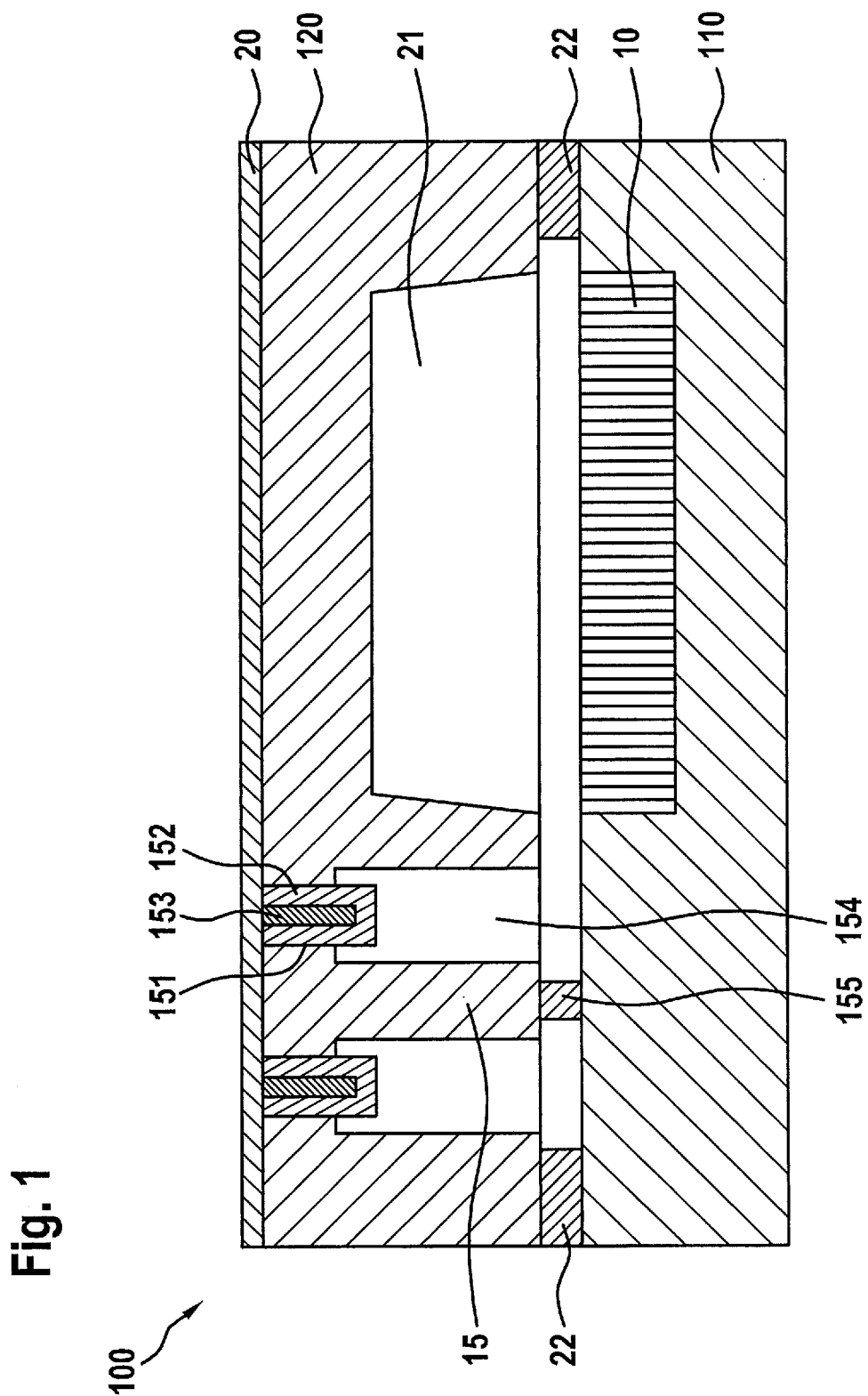
FIG. 1 shows a schematic sectional representation of a vertically integrated hybrid component 100 including a MEMS element 110 and an ASIC element 120 according to the present invention, in which the via is implemented in the semiconductor material of the ASIC substrate.
Figure 2:
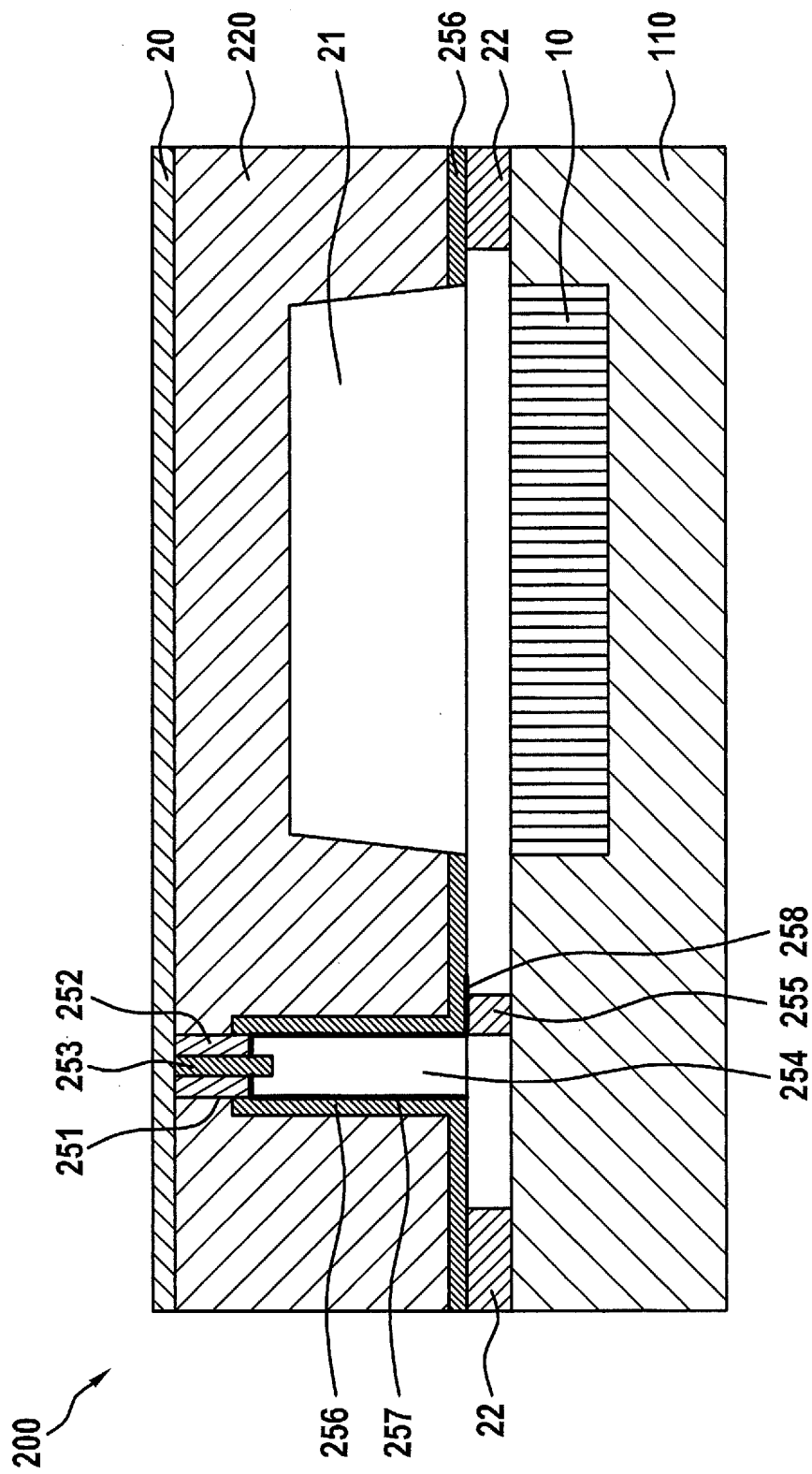
FIG. 2 shows a schematic sectional representation of a vertically integrated hybrid component 200 including a MEMS element 110 and an ASIC element 220 according to the present invention, in which the via is implemented in the form of a conductive core in the front-side trench and a rear-side hollow via.
Figure 3:
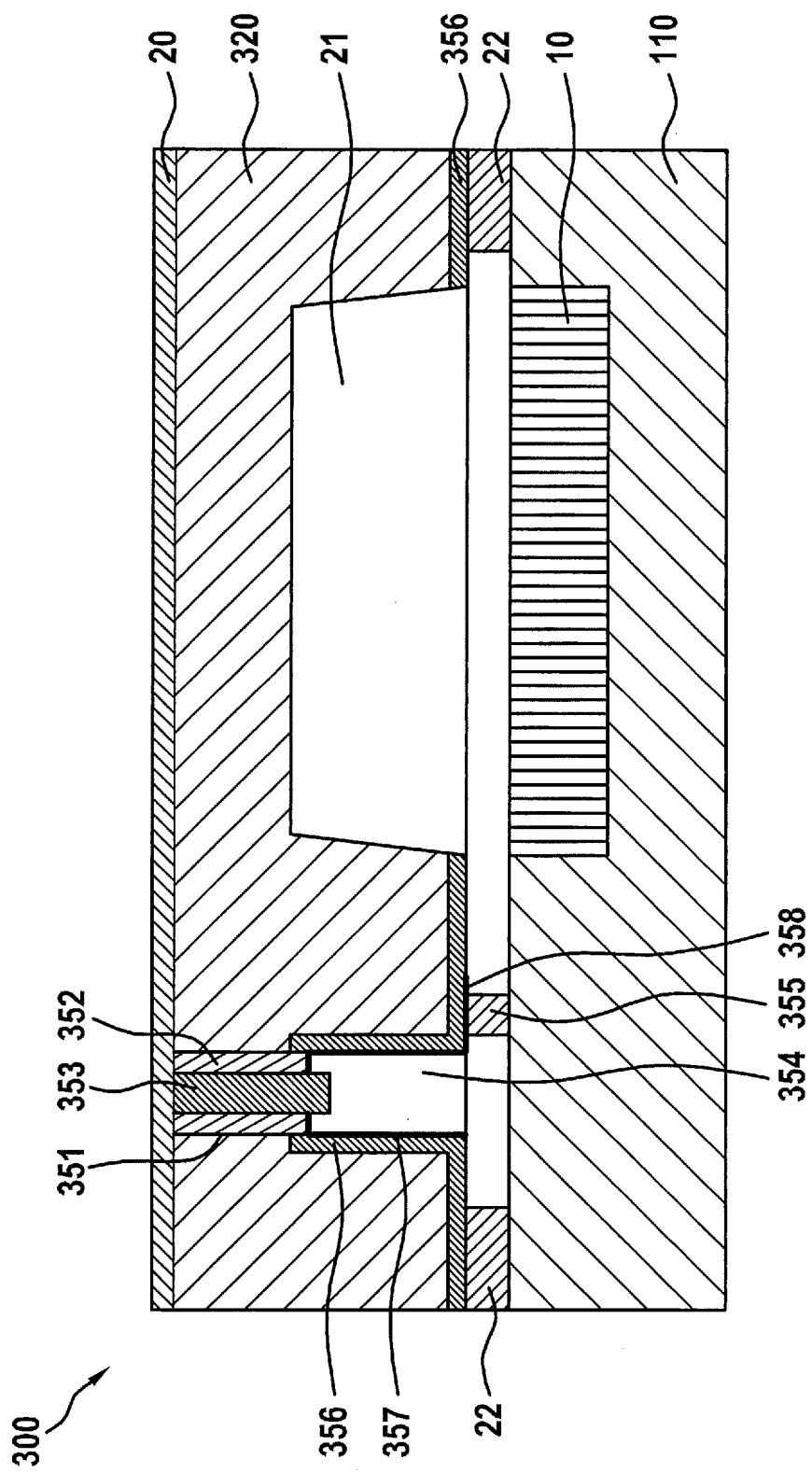
FIG. 3 shows a schematic sectional representation of a vertically integrated hybrid component 300 including a MEMS element 110 and an ASIC element 320 according to the present invention, in which the via is implemented in the form of a front-side filled metal via and a rear-side hollow via.

All three components 100, 200 and 300 shown in FIGS. 1 through 3 include a MEMS element 110 including a micromechanical sensor structure 10, which is formed in the front side of MEMS element 110. Furthermore, components 100, 200 and 300 each include an ASIC element 120, 220 and 320, the rear side of which is installed on the front side of MEMS element 110, so that these two elements form a chip stack or a wafer-level package. The circuit functions of ASIC element 120, 220 or 320 are formed in the front side of ASIC element 120, 220 or 320, which is indicated in this case in the form of a surface layer 20. A cavern 21 is formed in the rear side of ASIC element 120, 220 or 320, the cavern being situated above micromechanical sensor structure 10 of MEMS element 110, thus protecting it against external interfering influences but not limiting its function-related movability.

Formed on each side of cavern 21, a via is formed which electrically connects circuit functions 20 in the front side with the rear side of ASIC element 120, 220 or 320. In all three of the specific embodiments shown here, the electrical connection between ASIC element 120, 220 or 320 and MEMS element 110 was established together with the mechanical connection by bonding, which is explained once again in the following for each of the three exemplary embodiments.

In the first specific embodiment shown in FIG. 1—component 100—the front side of via 15 is defined by an annular front-side trench 151, which in the way of a bottom-trench isolation, was initially lined with a dielectric material 152, such as an oxide, and was subsequently completely filled with polysilicon 153. The rear side of via 15 is defined by an open, likewise annular, rear-side trench 154, which opens into filled front-side trench 151, 152, 153. Together with rear-side trench 154, front-side trench 151, 152, 153 forms in this case an annular isolation structure, which extends across the entire thickness of ASIC substrate 120 and electrically isolates a substrate area 15 as a via.

Bottom-trench isolation structure 151, 152, 153 for the front-side definition of via 15 was produced after or together with the CMOS processing of active front side 20 of ASIC substrate 120. After the front-side processing was concluded, the rear side of ASIC substrate 120 was initially thinned, before a bonding frame 22 was applied to the rear side of ASIC substrate 120 for the mechanical connection and an electrical connection area 155 was applied in the area of via 15. Only after that was the rear side of ASIC substrate 120 structured. In this process, in addition to cavern 21, rear-side trench 154 was also produced, which opens into filled front-side trench 151, 152, 153. When ASIC substrate 120 was installed on MEMS substrate 110, a hermetically sealed connection was established between the rear side of ASIC substrate 120 and the front side of MEMS substrate 110 using bonding frame 22. In this process, an electrical connection was also established between via 15 and MEMS substrate 110 via electrical connection area 155. Since via 15 lies within sealed bonding frame 22, it is protected against external interfering influences. An electrical isolation layer and filling of rear-side trench 154 are for that reason not absolutely necessary.

In component 200 shown in FIG. 2, the front side of the via is defined by a blind hole-like front-side trench 251, which likewise in the way of a bottom-trench isolation, was initially lined with a dielectric oxide 252 and was subsequently completely filled with polysilicon 253. The rear side of the via is defined by an open, likewise blind hole-like, rear-side trench 254, which opens into filled front-side trench 251, 252, 253. In contrast to the specific embodiment shown in FIG. 1, rear-side trench 254 is, however, in this case configured in the way of a hollow via. For this purpose, a dielectric layer 256 was initially produced on the rear side of ASIC substrate 220 and, in particular, on the wall of rear-side trench 254. Dielectric layer 256 was subsequently opened on the bottom of rear-side trench 254, in order to expose the lower end of polysilicon core 253 of bottom-trench isolation structure 251, 252, 253 in the front side of ASIC substrate 220. Using a suitable coating method, a barrier layer, which is not described in greater detail here, and a seed layer of copper were subsequently applied, which was subsequently reinforced with copper in an electroplating process. Copper layer 257 thus produced on the rear side of ASIC substrate 220 was subsequently structured as a wiring level. In this process, a terminal pad 258 was produced on the rear side of ASIC substrate 220.

The via for the electrical connection between active front side 20 of ASIC substrate 220 and the wiring level on its rear side is formed in this case by polysilicon core 253 of the bottom-trench isolation structure in combination with metallization 257 of rear-side trench 254.

Also in the case of component 200, ASIC substrate 220 was installed on the front side of MEMS element 110 using a bonding frame 22 and an electrical connection area 255. Since the via of component 200 also lies within hermetically sealed bonding frame 22, it is protected against external interfering influences. Consequently, no additional measures are required for protecting the hollow via structure of rear-side trench 154.

In the case of component 300 shown in FIG. 3, the front side of the via is likewise defined by a blind hole-like front-side trench 351. However, this front-side trench was not filled in the way of a bottom-trench isolation as in the case of component 200, but instead was filled with a copper core 353 like a metal or copper via, the copper core being electrically isolated from adjacent ASIC substrate 320 by a dielectric layer 352. This copper via 351, 352, 353 is connected electrically to circuit components 20 in the active front side of ASIC substrate 320.

On the rear side, the via—as in the case of component 200—is defined by an open, likewise blind hole-like rear-side trench 354, which opens into front-side copper via 351, 352, 353 and is configured as a hollow via. Consequently, metal plating 357 on the wall of rear-side trench 354 and terminal pad 358 on the rear side of ASIC substrate 320 are electrically isolated from the substrate material by a dielectric layer 356. The electrical connection between active front side 20 of ASIC substrate 320 and its rear side is formed in this case by copper core 353 of the front-side filled copper via in combination with metallization 357 of rear-side hollow via 354.

The mechanical and electrical connection between ASIC substrate 320 and MEMS substrate 110 was established, as in the case of component 200, using a bonding frame 22 and an electrical connection area 355.

What is claimed is:

1. An ASIC element, comprising:
    an active front side in which circuit functions are implemented; and
    at least one via which establishes an electrical connection between the active front side and a rear side of the ASIC element;
    wherein the front side of the via is defined by at least one front-side trench which is completely filled, and wherein the rear side of the via is defined by at least one rear-side trench which is not completely filled, the rear-side trench opening into the filled front-side trench.

2. The ASIC element as recited in claim 1, wherein the front-side trench and the rear-side trench are implemented as annular isolation trenches which electrically isolate a selected substrate area extending across the complete thickness of the ASIC substrate, the selected substrate area functioning as the at least one via.

3. The ASIC element as recited in claim 1, wherein:
    the front-side trench is electrically isolated from the adjacent semiconductor material by at least one dielectric layer;
    the front-side trench is filled with an electrically conductive material;
    the rear-side trench is electrically isolated from the adjacent semiconductor material by at least one dielectric layer; and
    at least one printed conductor track is routed from a wiring level on the rear side of the ASIC element on the wall of the rear-side trench to the electrically conductive material filling the front-side trench.

4. The ASIC element as recited in claim 3, wherein the front-side trench is filled with polysilicon.

5. The ASIC element as recited in claim 3, wherein the front-side trench is filled with a metal, and at least one metallic printed conductor track is routed from a wiring level on the rear side of the element on the wall of the rear-side trench to the metal filling the front-side trench.

6. The ASIC element as recited in claim 5, wherein the front-side trench extends into the depth of a bottom-trench isolation of the circuit functions in the active front side.

7. A vertically integrated hybrid component, comprising:
    at least one ASIC element including:
        an active front side in which circuit functions are implemented; and
        at least one via which establishes an electrical connection between the active front side and a rear side of the ASIC element;
        wherein the front side of the via is defined by at least one front-side trench which is completely filled, and wherein the rear side of the via is defined by at least one rear-side trench which is not completely filled, the rear-side trench opening into the filled front-side trench; and
    at least one additional element, wherein the rear side of the ASIC element is installed on the additional element such that the rear-side trench of the at least one via is sealed and a conductive connection exists between the at least one via and the at least one additional element.

* * * * *